(12) United States Patent
Arita et al.

(10) Patent No.: US 6,239,036 B1
(45) Date of Patent: May 29, 2001

(54) APPARATUS AND METHOD FOR PLASMA ETCHING

(75) Inventors: Kiyoshi Arita, Fukuoka-ken; Hiroshi Haji, Chikushino, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/452,869

(22) Filed: Dec. 2, 1999

(30) Foreign Application Priority Data

Dec. 3, 1998 (JP) .................................................. 10-343909

(51) Int. Cl.[7] ............................ H01L 21/302; C23F 1/02; B44C 1/22
(52) U.S. Cl. ............................ 438/714; 438/715; 216/71; 156/345
(58) Field of Search ............................... 156/345; 216/71; 438/714, 715

(56) References Cited

U.S. PATENT DOCUMENTS

| | | | |
|---|---|---|---|
| 5,254,213 | * 10/1993 | Tamaki | 156/655 |
| 5,300,460 | * 4/1994 | Collins et al. | 437/225 |
| 5,399,527 | * 3/1995 | Tabara | 437/194 |
| 5,853,602 | * 12/1998 | Shoji | 216/46 |
| 6,030,489 | * 2/2000 | Hwang | 156/345 |

* cited by examiner

*Primary Examiner*—Gregory Mills
*Assistant Examiner*—George Goudreau
(74) *Attorney, Agent, or Firm*—Stevens, Davis, Miller & Mosher, L.L.P.

(57) ABSTRACT

A plasma etching apparatus and a plasma etching method for conducting a plasma etching treatment for a substrate to be treated placed on one of parallel plate electrodes disposed oppositely to each other in a treatment chamber, wherein gas supplying device is used to supply a mixed gas including oxygen and a fluorine gas in the treatment chamber and the plasma discharge is conducted between the parallel plate electrodes under the condition that the product PL of a distance L[m] between the plate electrodes and the pressure P[Pa] of the mixed gas in the treatment chamber takes a value within 2.5[Pa·m] to 15[Pa·m] so as to efficiently perform an etching treatment, at a low cost, and in uniform.

10 Claims, 5 Drawing Sheets

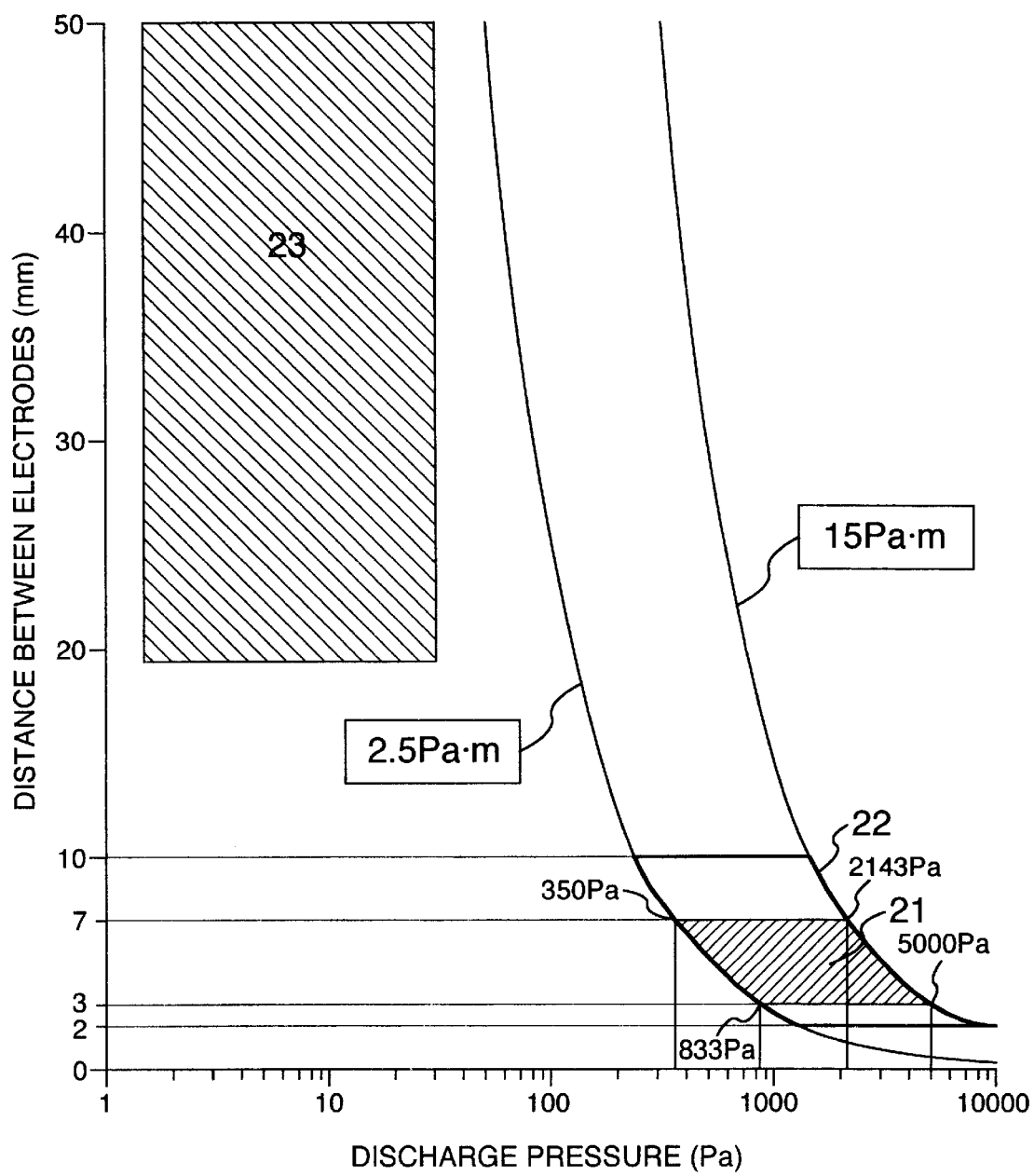

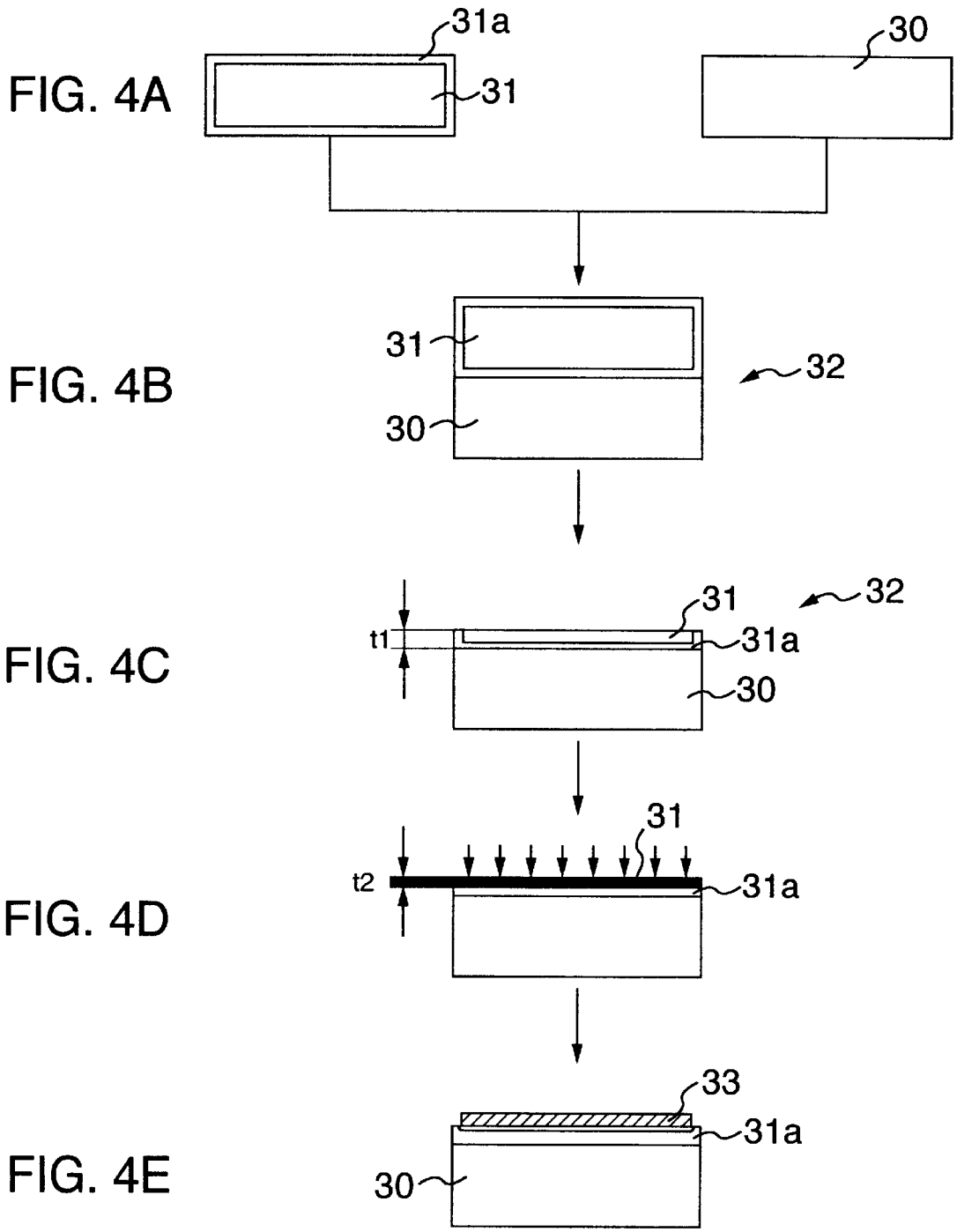

APPARATUS AND METHOD FOR PLASMA ETCHING

BACKGROUND OF THE INVENTION

The present invention relates to an apparatus and a method for plasma etching processing silicon substrates applied to semiconductor devices or the like.

RELATED ART

Plasma etching is a well-known method for treating silicon substrates applied to semiconductor devices or the like. According to this method, an object to be treated, for example, a silicon substrate is treated as follows. At first, the silicon substrate is placed in a treatment chamber, which is then evacuated. After evacuation, a gas for generating plasma is supplied in the chamber, then a high frequency voltage is applied to between electrodes disposed therein so as to generate plasma. As a result, ions and electrons are generated in the chamber and the substrate is treated by the etching action of those ions and electrons. Conventionally, those electrodes for discharging the plasma were disposed so as to be separated by approximately 30 to 80 mm from each other and the pressure in the treatment chamber was lowered up to about 1 to 10 Pa when in plasma etching.

However, such a conventional plasma etching has been confronted with the following problems. First of all, when plasma etching is performed in a high vacuum state as described above, the etching rate, which indicates a velocity for removing the surface of the object silicon substrate by etching becomes 0.1 $\mu$m/min or so. Therefore, if the surface must be removed more, the etching treatment takes a long time and further, since a high vacuum degree is required, the exhaust process for evacuation takes a long time for each treatment cycle. Along with such a low etching rate described above, those long time treatments result in further significant reduction of the efficiency in the entire substrate treatment.

Furthermore, because the conventional plasma etching requires such a high vacuum degree, the cost of the vacuum system facility also rises significantly. And furthermore, because the object substrate is placed in such a high vacuum state, it is impossible to employ a method of vacuum suction to hold the substrate. Instead, an expensive electrostatic suction method or a mechanical holding method had to be employed to hold the substrate. This was why it was very difficult to simplify the facility and reduce the cost of the facility. In addition, in case of the conventional plasma etching, it was difficult to generate the plasma in uniform between the electrodes. Thus, the etching effect was partially varied on the object substrate, which made stable etching difficult. Accordingly, in such the conventional plasma etching, there was a problem that it was difficult to process the etching for the substrate at a low cost, in uniform, and efficiently.

SUMMARY OF THE INVENTION

Under such circumstances, therefore, it is an object of the present invention to provide an apparatus and a method for plasma etching processing an object efficiently, in uniform, and at a low cost.

The plasma etching apparatus of the present invention, in which an object substrate to be treated is placed on one of parallel plate electrodes disposed oppositely to each other in a treatment chamber and the plasma etching treatment is conducted to the substrate, comprises gas supply means for supplying a mixed gas including oxygen and a fluorine gas in the treatment chamber, and the plasma discharge is conducted between the parallel plate electrodes on a condition that the product PL of the distance L[m] between the plate electrodes and the mixed gas pressure P[Pa] in the treatment chamber satisfies a range within 2.5[Pa·m] to 15[Pa·m].

The plasma etching apparatus of the present invention may also be used on a condition that the distance L between the plate electrodes is within 3[mm] to 7[mm].

Further, this plasma etching apparatus may be used on a condition that the volume ratio of the oxygen in the mixed gas is within 5% to 20%.

Furthermore, the plasma etching apparatus of the present invention may be provided with means for holding the object substrate to be treated by means of vacuum suction on one of the parallel plate electrodes and means for cooling the substrate.

The plasma etching method of the present invention, in which an object substrate to be treated is placed on one of parallel plate electrodes disposed oppositely to each other in a treatment chamber and the plasma etching treatment is conducted to the substrate, comprises the steps of supplying a mixed gas including oxygen and a fluorine gas, and conducting plasma discharge between the parallel plate electrodes on a condition for satisfying a value of a product P[Pa] of the distance L[m] between the parallel plate electrodes and the gas pressure P[Pa] in the treatment chamber within 2.5[Pa·m] to 15[Pa·m].

The plasma etching method of the present invention may also apply to the object substrate composed of silicon or silicon compound.

The plasma etching method of the present invention may also apply on a condition for satisfying a value of the distance L between the plate electrodes within 3[mm] to 7[mm].

The plasma etching method of the present invention may also apply on a condition for satisfying a volume ratio of the oxygen in the mixed gas within 5 to 20%.

The plasma etching method of the present invention may also apply on a condition for satisfying an etching speed of 10,000 Å (Angstroms)/min. or more for the object substrate.

The plasma etching method of the present invention may also comprise further steps of holding the object substrate by vacuum suction on one of the parallel plate electrodes and cooling the substrate by cooling means.

According to the present invention, therefore, the etching conditions can be set so that the product of the distance between the parallel plate electrodes and the pressure of the mixed gas in the treatment chamber takes a value within a predetermined range respectively for improving the etching efficiency. The plasma etching can thus be conducted at a lower cost and more efficiently.

BRIEF DESCRIPTION OF THE DRAWINGS

FIG. 3 is a graph showing a plasma etching condition in the first embodiment of the present invention;

FIGS. 4A to 4E show processes of manufacturing a semiconductor device in the first embodiment according to the present invention.

PREFERRED EMBODIMENTS OF THE INVENTION

Figure 1:
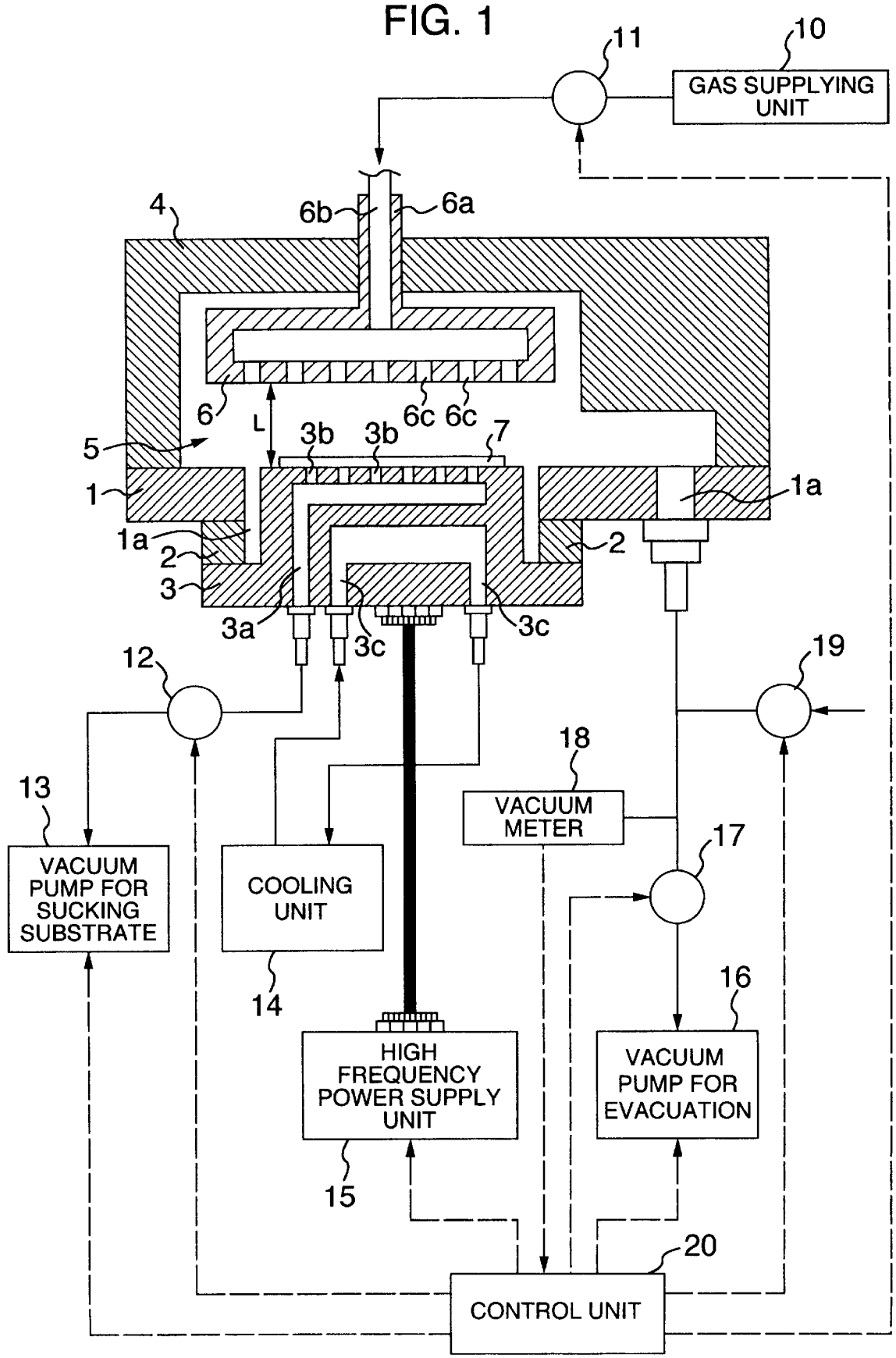
FIG. 1 is a cross sectional view of a plasma etching apparatus in a first embodiment according to the present invention.
Figure 2:
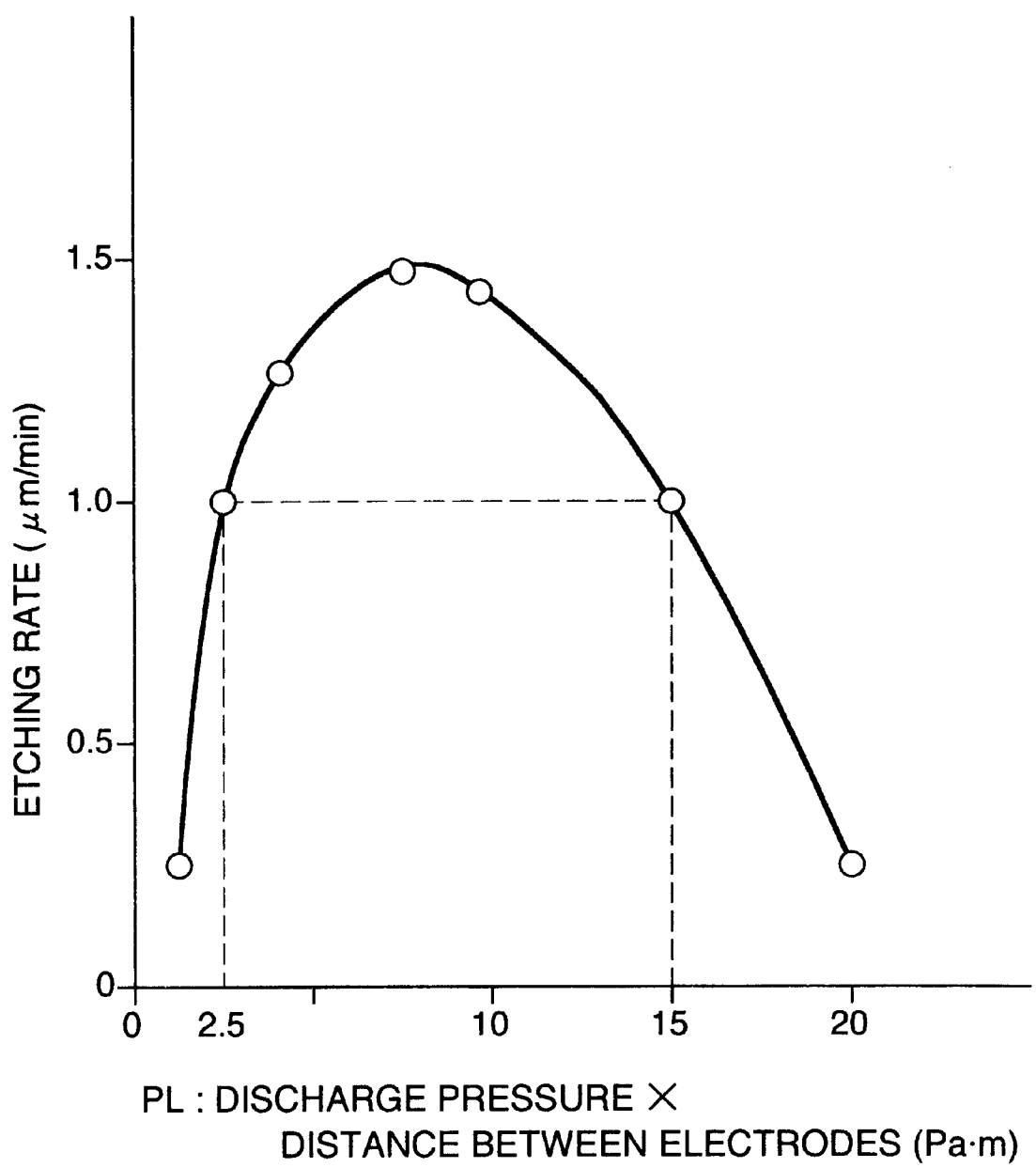
FIG. 2 is a graph showing an etching rate of the plasma etching apparatus in the first embodiment of the present invention.

FIG. 1 is a cross sectional view of a plasma etching apparatus in a first embodiment according to the present invention. FIG. 2 is a graph showing an etching rate of the same plasma etching apparatus. FIG. 3 is a graph showing a plasma etching condition of the same. FIGS. 4A to 4E show the processes of manufacturing the semiconductor device in the first embodiment.

At first, the plasma etching apparatus will be described with reference to FIG. 1. In FIG. 1, a base member 1 is provided with an aperture 1a. A lower electrode assembly 3 is fit in the aperture 1a via an insulating member 2 from the bottom side. A covering member 4 is put on the base member 1 air-tightly. A space enclosed tightly by the covering member 4, the lower electrode assembly 3 and the base member 1 is used as a treatment chamber 5 for performing plasma etching for an object substrate 7 to be treated placed on the lower electrode assembly 3. The covering member 4 is moved up/down by an up/down moving member (not illustrated), thereby the treatment chamber 5 is opened/closed so as to carry in/out the substrate 7. The substrate 7 is composed mainly of silicon or silicon compound such as silicon oxide.

A supporting member 6a of the upper electrode assembly 6 is passed through the upper portion of the covering member 4 air-tightly and the lower surface of the upper electrode assembly 6 is disposed oppositely to the upper surface of the lower electrode assembly 3. The former and the latter are formed approximately like a flat plate. That is, the upper electrode assembly 6 and the lower electrode assembly 3 are formed as parallel plate electrodes to each other. However, the lower surface of the upper electrode 6 and the upper surface of the lower electrode 3 must not be completely like a flat plate respectively. They may be more or less uneven on their surfaces. The covering member 4 may also be structured so as to be used also as the upper electrode assembly.

The supporting member 6a is moved up/down to adjust the position of the upper electrode assembly 6 in height in the treatment chamber 5, thereby the distance L between the lower surface of the upper electrode assembly 6 and the upper surface of the lower electrode assembly 3 (hereafter, to be referred to as the distance L between electrodes) can be set to a predetermined value. That is, the supporting member 6a functions as means for setting the distance between those electrodes. This electrode-electrode distance setting means may set the distance L between the electrodes by adjusting it when the apparatus is started up or may set the distance L at the manufacturing time so as to use the apparatus with fixing the set distance L when the apparatus is started up.

The lower surface of the upper electrode assembly 6 is provided with many gas holes 6c and the gas holes 6c are communicated with the gas supply hole 6b provided inside the supporting member 6a. The gas supply hole 6b is connected to a gas supply unit 10 via a valve 11. The gas supply unit 10 is gas supply means which supplies a mixed gas including an oxygen gas and such a fluorine gas as sulphur hexafluoride (SF6), carbon tetrafluorine (CF4), etc. The volume ratio of the oxygen gas in the mixed gas is 5% to 20%.

The base member 1 is also provided with supply/evacuation hole 1a and the supply/evacuation hole 1a is connected to a vacuum pump 16 for evacuation via a valve 17. When the treatment chamber 5 is closed, the vacuum pump 16 for evacuation is driven to evacuate and vacuum the treatment chamber 5. A vacuum gauge 18 is applied for detecting the vacuum degree and according to the detected result, a control unit 20 controls the vacuum pump 16, thereby a predetermined vacuum degree is reached in the treatment chamber 5.

While the gas supply unit 10 supplies a mixed gas into the treatment chamber 5 via the gas holes 6c, the gas pressure in the treatment chamber is detected with the vacuum gauge 18 and the control unit 20 controls the valve 11 according to the detected result of the gas pressure, thereby the mixed gas pressure P in the treatment chamber 5, that is, the pressure P of the mixed gas for discharging the plasma used for plasma etching (hereafter, to be referred to as a discharge pressure) can be set to a pressure predetermined by the control unit 20. Consequently, the gas supply unit 10 for controlling the pressure P of the mixed gas, the valve 11, the vacuum gauge 18, and the control unit 20 are united into controlling means for controlling the discharge pressure P so as to set a value of the product PL within a predetermined range.

An air inlet value 19 is also connected to the supply/evacuation hole 1a. The air inlet valve 19 is opened to take the air used for breaking the vacuum state in the treatment chamber 5. The upper surface of the lower electrode assembly 3 is also provided with many suction holes 3b and the suction holes 3b are communicated with a suction hole 3a provided inside the lower electrode assembly 3. The suction hole 3a is connected to the vacuum pump 13 for sucking the substrate via a valve 12. While the substrate 7 is placed on the lower electrode assembly 3, the vacuum pump 13 is driven to suck the substrate with a vacuum degree higher than the vacuum in the treatment chamber 5, that is, with a pressure lower than the pressure in the chamber 5, thereby the substrate 7 is sucked and held on the lower electrode assembly 3. Accordingly, the suction holes 3b and the vacuum pump 13 are united into holding means for holding the substrate 7 by means of vacuum suction.

Inside the lower electrode assembly 3 is provided a cooling passage 3c. The passage 3c is connected to a cooling unit 14, which serves as cooling means. Such a cooling medium as water, etc. is circulated between the cooling unit 14 and the passage 3c, thereby the heat generated in a plasma etching treatment is absorbed by the cooling medium so as to cool down the object substrate 7. Consequently, etching can be made even for a substrate already formed with circuits at one side without any damage by overheat.

The lower electrode assembly 3 is electrically connected to a high frequency power supply unit 15 provided with a tuning circuit. The high frequency power supply unit 15 is driven to apply a high frequency voltage to the lower electrode assembly 3. If the mixed gas is supplied from the gas supply unit 10 in the treatment chamber 5 after the chamber 5 is evacuated and a high frequency is applied to the lower electrode assembly 3 while a predetermined pressure is kept in the chamber 5, then plasma discharging occurs between the lower and upper electrode assemblies 3 and 6.

Receiving a detected result from the vacuum gauge 18, the control unit 20 controls the vacuum pump 13 for sucking the substrate, the cooling unit 14, the high frequency power supply unit 15, the vacuum pump 16 for evacuation, and the values 11, 12, and 17, thereby controlling the whole plasma etching apparatus. Consequently, a plasma etching treatment is conducted for the substrate 7 placed on the lower electrode assembly 3. This plasma etching treatment will be described with reference to the reaction expressions shown below.

[Chemical Expressions]

$$CF_4 + e \rightarrow F^*(g) + CF_3^*(g) + e \qquad (1)$$

$$Si + 4F^* \rightarrow SiF_4(g) \qquad (2)$$

$$CF_3^* \to C + 3F^* \quad (3)$$

$$C + nF^* \to CF_n \quad (4)$$

$$CF_n + O_2^* \to CO_2(g) + nF^* \quad (5)$$

As shown in the expression (1), plasma is discharged for a mixed gas including $CF_4$, thereby the $CF_4$ is transformed into gaseous carbon radical trifluoride $CF_3^*(g)$ just like gaseous radical fluorine $F^*$ (g). This $F^*(g)$ acts on the Si, which is a component of the substrate 7. As a result, Si is transformed into gaseous $SiF_4$, then transpired and removed from the surface of the substrate 7 as shown in the expression (2). And, the $CF_3^*$ generated due to the action of the expression (1) is separated into C and $3F^*$ as shown in the expression (3), then the $F^*$ acts on the C generated here, thereby $CF_n$ is generated as shown in the expression (4).

Then, $O_2^*$ acts on this $CF_n$, thereby $CO_2(g)$ and $F^*$ are generated as shown in the expression (5). The $O_2^*$ is a radical oxygen gas generated from the oxygen gas included in the mixed gas by plasma. This $F^*$ is used for the action shown in the expression (2) to remove Si. Because the substrate 7 composed of Si is placed in the plasma of the mixed gas including oxygen and a fluorine gas, the etching treatment is conducted to remove Si from the surface of the substrate. The same etching effect can also be obtained by the use of $SF_6$ instead of $CF_4$.

Next, the relationship between an etching rate and each plasma etching condition will be described with reference to FIGS. 2 and 3. The etching rate indicates an etching velocity the plasma etching treatment described above. FIG. 2 shows a graph of the correlation between an etching rate (removed silicon thickness/min.) and a product PL (unit: Pa·m) of a discharge pressure P and a distance L between electrodes. The etching rate is shown with an axis of ordinate in the graph. As shown clearly in FIG. 2, the etching rate is correlated with the product PL as described above. The maximum value of the etching rate is obtained when the product PL takes a specific value. In other words, in order to obtain a high etching rate, a proper combination of the discharge pressure P and the distance L between electrodes must be selected so as to set the product PL within a specific value.

For example, in order to obtain an etching rate of 1.0 μm (10,000 Å)/min. or over, it is only needed to set the value of the product PL within 2.5 to 15[Pa·m] as shown in FIG. 2. FIG. 3 shows concrete values to be set for the discharge voltage P and the distance L between electrodes as etching conditions. In FIG. 3, two curves show a boundary between the values of the product PL within 2.5 to 15[Pa·m]. In FIG. 3, the range shown with a hatching portion 21 inside the thick lines indicates an optimized range in which a favorable etching rate is obtained. More concretely, the etching conditions are set for the distance L between electrodes within 3 to 7 mm and for the discharge pressure P within 350 to 5000 Pa. The range 22 enclosed by thick lines indicates a range in which proper etching conditions can be set practically. More concretely, the etching conditions can be selected within 2 to 10 mm for the distance L between electrodes and within 833 to 10,000 Pa (atmospheric pressure) for the discharge pressure P.

The range 23 in FIG. 3 indicates plasma etching conditions for the conventional dry etching. The range 23 is shown in an area in which the discharge pressure P is low and the distance L between electrodes is large. More concretely, conventionally, the discharge pressure P was 100 Pa or less and the distance L between electrodes was about 20 mm or more. If a dry etching treatment was done on those conditions, the etching rate would become only 0.1 μm/min. or so. In other words, according to the plasma etching in this embodiment, the etching rate is improved by 10 to 15 times that of the conventional dry etching even when only the etching rate is compared simply between both methods.

This plasma etching apparatus configured as described above uses a plasma etching method, which will be described with reference to FIGS. 4A to 4E with respect to a manufacturing method of semiconductor device used in the SOI (Silicon On Insulator) manufacturing processes. The SOI is formed by placing a silicon oxide film under an extremely thin film made of silicon with which circuits are formed. The SOI can improve the velocity in the semiconductor device and save the power required for the semiconductor device.

In FIG. 4A, an Si wafer 30 and an Si wafer 31 coated with an oxide film 31a thereon are prepared as a material for composing an SOI. As shown in FIG. 4B, the Si wafer 31 coated with an oxide film is attached on and connected to the Si wafer 30, thereby manufacturing a silicon substrate 32 provided with an SiO structure. Then, the silicon substrate 32 is subjected to a polishing process in which the Si wafer 31 coated with an oxide film is almost polished away as shown in FIG. 4c, so that the Si wafer 31 having only a thickness t1 of about 20 μm including the oxide film 31a is left on the wafer 30. Since the silicon film of an oxide film 31a must be an extremely thin film of about 1 μm, a plasma etching treatment is employed for polishing the silicon film finely up to this film thickness.

The polished wafer 30 is then transferred to the plasma etching apparatus shown in FIG. 1 and placed on the lower electrode assembly 3 in the treatment chamber 5. Then, the plasma etching conditions are selected so as to set the product PL of the discharge pressure P and the distance L between electrodes in a range within 2.5 to 15[Pa·m]. After this, the plasma etching treatment is performed on the above set conditions for a predetermined time, thereby the silicon film on the oxide film 31a is thinned up to a film thickness t2 of about 1 μm as shown FIG. 4D. And, on this silicon thin film is formed a circuit 33 configured by transistors, etc. as shown in FIG. 4E. Then, the wafer 30 is cut into chips in a dicing process to complete semiconductor devices provided with an SOI structure respectively.

FIG. 5 shows each process employed in a second embodiment of the manufacturing method of the semiconductor device according to the present invention. In this second embodiment, after circuits are formed on the surface of the silicon substrate, the plasma etching treatment described in the first embodiment is performed for polishing the back side of the substrate on which the circuits are formed so as to thin the substrate.

Figure 5A:
FIGS. 5A to 5G show processes for manufacturing a semiconductor device in a second embodiment according to the present invention.
Figure 5B:
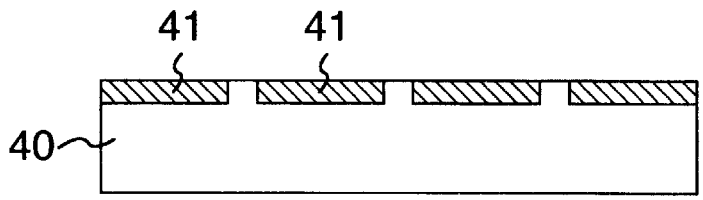
Figure 5C:
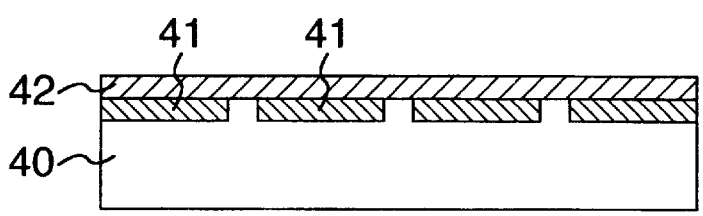
Figure 5D:
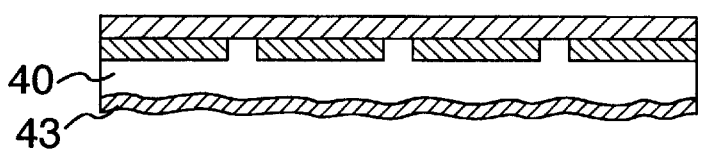

In FIG. 5A, 40 denotes an Si wafer. On the surface of the Si wafer 40 is formed a circuit 41 as shown in FIG. 5B. Then, as shown in FIG. 5C, protection resin is covered on the circuit 41 to form a protection film 42. After this, the Si wafer 40 is polished, so that the Si wafer 40 is polished on the back side of the surface, on which circuits are formed, and thinned. In this polishing process, a distortion layer 43 is left on the surface of this polished side. The distortion layer 43 includes stresses and fine cracks generated on the silicon surface due to an external mechanical force in the polishing process. Because they will lower the strength of the semiconductor device after completion, they must be removed.

Figure 5E:
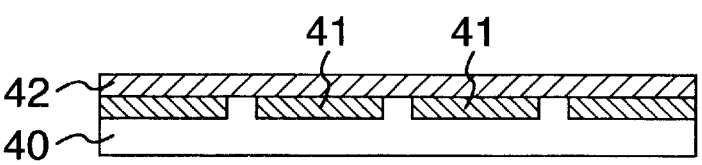

To remove such a distortion layer, the plasma etching as described in the first embodiment is performed as follows. At first, the object Si wafer 40 is placed in the treatment chamber 5 of the plasma etching apparatus shown in FIG. 1. Then, just like in the first embodiment, the etching conditions are set so that the product PL of the discharge voltage P and the distance L between electrodes satisfies the range within 2.5 to 15[Pa·m]. Consequently, as shown in FIG. 5E, the distortion layer 43 is removed and the bottom surface of the Si wafer 40 is further smoothed. The Si wafer 40 can thus be protected from deterioration of the strength with respect to its shape to be caused by stress concentration. At this time, as shown in FIG. 1, the lower electrode assembly 3 is cooled down by the cooling unit 14, so the circuit 41 already formed on the Si wafer 40 is protected from overheat damages.

Figure 5F:
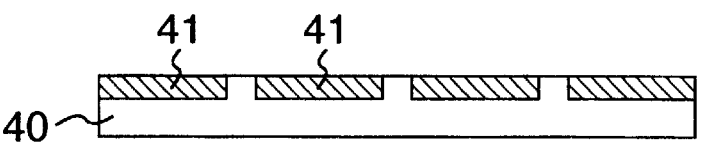
Figure 5G:

After this, the protection film 42 is removed from the surface of the Si wafer 40 as shown in FIG. 5F, then the wafer transferred to the dicing process is cut into semiconductor device chips 44. This completes the manufacturing of the semiconductor devices as shown in FIG. 5G.

As shown In the first and second embodiments, the present invention allows the plasma etching conditions to be set so that the product PL of the discharge pressure P and the distance L between electrodes satisfies the range within 2.5 to 15[Pa·m] in the plasma etching treatment that uses a mixed gas including oxygen and a fluorine gas. Consequently, the present invention can obtain the following excellent effects.

At first, because the plasma etching in the Invention employs a vacuum degree lower (high pressure) than that of the conventional plasma dry etching, the density of particles in the etching is high, thereby it is possible to obtain a higher etching rate than that of the conventional etching. In addition, because it is no need to evacuate the treatment chamber to a high vacuum degree, the evacuation time for vacuuming in the chamber and the air lead-in time when in breaking the vacuum state in the chamber can be shortened. Along with such the improvement of the etching rate, the tact time of the entire plasma etching treatment can be shortened more significantly than that of the conventional method, and the treatment efficiency can be improved up to about 10 times that of the conventional method.

Furthermore, because a high vacuum degree is not required for the plasma etching, the configuration of such a vacuum system as the vacuum pump of the plasma etching apparatus can be simplified. In addition, because it is easy to secure a pressure difference between the pressure in the chamber and the suction pressure for sucking the object substrate by vacuum for the same reason when the substrate is held in the treatment chamber, the substrate can be sucked and held by vacuum suction with a simplified method. Accordingly, the mechanical simplification and the low cost of the plasma etching apparatus can be realized. In addition, even when compared with the conventional wet etching that uses a chemical solution, the etching treatment of the invention is more efficient and requires a lower cost. The plasma etching produces no waste solution, thereby it is possible to avoid environmental and ecological pollution. The plasma etching method of the present Invention has such excellent characteristics.

Furthermore, under the above described condition concerning quality because the distance between electrodes can be set narrower than that of the conventional method, the plasma can be generated in uniform between electrodes and the etching effect can be unified all over the object substrate. The plasma etching method of the present invention can thus assure stable plasma etching treatments with no variation.

According to the present invention, therefore, because the product of the distance between the parallel plate electrodes and the pressure of the mixed gas in the treatment chamber can be set to satisfy a predetermined range for improving the etching efficiency, the plasma etching can be performed very efficiently, in uniform quality, and at a low cost.

What is claimed is:

1. A plasma etching apparatus for plasma etching the surface of a silicon substrate opposite the circuit-side surface of said substrate on one of parallel plate electrodes disposed oppositely to each other in a treatment chamber, said plasma etching apparatus comprising gas supplying means for supplying a mixed gas including oxygen and a fluorine gas in said treatment chamber, and setting means for setting a distance L between said parallel plate electrodes, wherein plasma discharge is conducted between said parallel plate electrodes on a condition that the product PL of a distance L between said electrodes and the pressure P of said mixed gas in said treatment chamber takes a value within 2.5Pa·m to 15Pa·m; and wherein the plasma etching rate of said substrate is over one micron per minute, and wherein said distance L is a value between 3 mm to 7 mm.

2. The plasma etching apparatus according to claim 1, wherein the volume ratio of oxygen in said mixed gas is within 5% to 20%.

3. The plasma etching apparatus according to claim 1, said apparatus further comprising holding means for holding said substrate by means of vacuum suction on said one of said parallel plate electrodes; and cooling means for cooling said substrate.

4. The plasma etching apparatus according to claim 1, wherein said setting means for setting said distance L between said parallel plate electrodes moves up/down one of said parallel plate electrodes.

5. A plasma etching method for plasma etching a surface of a silicon substrate opposite the circuit-side surface of said substrate on one of parallel plate electrodes disposed oppositely to each other in said treatment chamber, comprising the steps of;

supplying a mixed gas including oxygen and a fluorine gas in said treatment chamber;

conducting plasma discharge between said parallel plate electrodes on a condition that the product PL of a distance L between said parallel plate electrodes and the pressure P of said mixed gas in said treatment chamber is set to satisfy a value within 2.5Pa·m to 15Pa·m; and wherein the plasma etching rate of said substrate is over one micron per minute.

6. The plasma etching method according to claim 5, wherein said distance L between said plate electrodes takes a value within 3 mm to 7 mm.

7. The plasma etching method according to claim 5, wherein the volume ratio of oxygen in said mixed gas is within 5% to 20%.

8. The plasma etching method according to claim 5, wherein said silicon substrate is held by means of vacuum suction on said one of said parallel plate electrodes, and cooled down by cooling means.

9. The plasma etching method according to claim 5, wherein setting means is used to set said distance L between said plate electrodes.

10. The plasma etching method according to claim 9, wherein said setting means for setting said distance between said plate electrodes is used to move upward and downward said one of said parallel plate electrodes.

* * * * *